United States Patent
Voo et al.

(10) Patent No.: US 7,558,014 B1
(45) Date of Patent: Jul. 7, 2009

(54) PROGRAMMABLE HIGH PASS AMPLIFIER FOR PERPENDICULAR RECORDING SYSTEMS

(75) Inventors: Thart Fah Voo, Singapore (SG); Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 10 days.

(21) Appl. No.: 10/876,216

(22) Filed: Jun. 24, 2004

(51) Int. Cl.
  G11B 5/02 (2006.01)
  H03G 3/00 (2006.01)
(52) U.S. Cl. .................................. 360/67; 330/282
(58) Field of Classification Search ................ None
  See application file for complete search history.

(56) References Cited

U.S. PATENT DOCUMENTS

| | | |
|---|---|---|
| 3,365,673 A | 1/1968 | Barditch et al. |
| 3,737,798 A | 6/1973 | Faraguet et al. |
| 3,760,287 A | 9/1973 | Harris |
| 3,918,005 A | 11/1975 | Bruckenstein et al. |
| 4,535,233 A | 8/1985 | Abraham |
| 4,564,818 A | 1/1986 | Jones |
| 4,724,315 A | 2/1988 | Goerne |
| 4,731,590 A | 3/1988 | Saari |
| 4,764,732 A | 8/1988 | Dion |
| 4,772,859 A | 9/1988 | Sakai |
| 4,914,402 A | 4/1990 | Dermitzakis et al. |
| 4,919,534 A | 4/1990 | Reed |
| 5,010,588 A | 4/1991 | Gimlett |
| 5,042,299 A | 8/1991 | Wells |
| 5,155,455 A | 10/1992 | Cowley et al. |
| 5,345,073 A | 9/1994 | Chang et al. |
| 5,382,920 A | 1/1995 | Jung |
| 5,532,471 A | 7/1996 | Khorramabadi et al. |
| 5,646,573 A | 7/1997 | Bayruns et al. |
| 5,793,230 A | 8/1998 | Chu et al. |
| 6,011,415 A * | 1/2000 | Hahn et al. .................. 327/103 |
| 6,037,841 A | 3/2000 | Tanji et al. |
| 6,057,738 A | 5/2000 | Ku et al. |
| 6,084,478 A | 7/2000 | Mayampurath |
| 6,114,913 A | 9/2000 | Entrikin |

(Continued)

FOREIGN PATENT DOCUMENTS

JP  406061752 A  3/1994

(Continued)

OTHER PUBLICATIONS

Charles A. Holt, "Electronic Circuits Digital and Analog", by John Wiley & Sons, Inc., 1978, pp. 423, 431, and 436.

(Continued)

*Primary Examiner*—Joseph H Feild
*Assistant Examiner*—Daniell L Negrón

(57) ABSTRACT

A high pass amplifier comprises a first amplifier including an input and an output. A second amplifier includes an input that communicates with the output of the first amplifier and an output. A first resistance includes a first end that communicates with the input of the first amplifier and an output that communicates with the output of the first amplifier. A first capacitance includes a first end that communicates with the input of the first amplifier. A second resistance includes a first end that communicates with a second end of the first capacitance and a second end that communicates with the output of the second amplifier. The high pass amplifier can be a differential mode amplifier.

63 Claims, 6 Drawing Sheets

U.S. PATENT DOCUMENTS

| | | | |
|---|---|---|---|
| 6,122,131 | A | 9/2000 | Jeppson |
| 6,169,764 | B1 * | 1/2001 | Babanezhad ............... 375/233 |
| 6,226,322 | B1 * | 5/2001 | Mukherjee ................ 375/229 |
| 6,292,052 | B1 | 9/2001 | Carlson |
| 6,330,279 | B1 | 12/2001 | Belser et al. |
| 6,353,324 | B1 | 3/2002 | Uber et al. |
| 6,466,091 | B1 | 10/2002 | Kejariwal et al. |
| 6,515,540 | B1 | 2/2003 | Prasad et al. |
| 6,525,589 | B1 | 2/2003 | Thomsen et al. |
| 6,538,833 | B2 * | 3/2003 | Choi ........................... 360/46 |
| 6,552,605 | B1 | 4/2003 | Yoon |
| 6,573,811 | B2 * | 6/2003 | Martin ....................... 333/172 |
| 6,593,810 | B2 | 7/2003 | Yoon |
| 6,642,496 | B1 | 11/2003 | Gulbransen |
| 6,762,644 | B1 | 7/2004 | Sutardja |
| 6,836,182 | B1 | 12/2004 | Sutardja |
| 6,958,656 | B2 | 10/2005 | Yamashita et al. |
| 7,023,271 | B1 | 4/2006 | Aram |
| 7,049,892 | B2 | 5/2006 | Matsunaga et al. |
| 2002/0153949 | A1 | 10/2002 | Yoon |

FOREIGN PATENT DOCUMENTS

| | | | |
|---|---|---|---|
| JP | H6-61752 | | 3/1994 |
| WO | WO 99/46607 | * | 9/1999 |
| WO | WO 99/466607 | | 9/1999 |

OTHER PUBLICATIONS

U.S. Appl. No. 10/072,843, filed Feb. 6, 2002, entitled, "Nested Transimpedance Amplifier".

U.S. Appl. No. 10/459,731, filed Jul. 11, 2003, entitled, "Nested Transimpedance Aplifier".

U.S. Appl. No. 10/814,534, filed Mar. 31, 2004, entitled, "Variable-Gain Constant-Bandwidth Transimpedance Amplifier".

U.S. Appl. No. 10/838,040, filed May 3, 2004, entitled, Nested Transimpedance Amplifer With Capacitive Cancellation of Input Parasitic Capacitance.

You et al., SA 21.2 "A Multistate Amplifier Topology with Nested Gm-C Compensation for Low-Voltage Application", IEEE International Solid-State Circuits Conference, Digest of Technical Papers, ISSCC97, Feb. 8, 1997, pp. 348-349.

W. Grise, Dept. of IET, Morehead State University, Morehead, KY; Application of the Operational Transconductance Amplifier (OTA) to Voltage-controlled Amplifiers and Active Filters; 10 pages.

Axel Thomsen, Dan Kasha, Wai Lee, Crystal Semiconductor Division, Cirrus Logic, Inc., Austin, Texas; A Five Stage Chopper Stabilized Instrumentation Amplifier Using Feedforward Compensation; 1998; 4 pages.

Axel Thomsen, Edwin de Angel, Sherry Ziachong Wu, Aryesh Amar, Lei Wang, Wai Lee, WA 20.1 A DC Measurement IC with $130nV_{pp}$ Noise in 10Hz; 2000 IEEE International Solid-State Circuits Conference; 9 pages.

Axel Thomsen, Edwin de Angel, Sherry Ziachong Wu, Aryesh Amar, Lei Wang, Wai Lee, WA 20.1 A DC Measurement IC with $130nV_{pp}$ Noise in 10Hz; ISSCC 2000/Session 20/Oversampled Converters/ Paper WA 20.1 ISSCC 2000 Slide Supplement; 5 pages.

M. Moyal, M. Groepl, H. Werker, G. Mitteregger, J. Schambacher; Xignal Technologies AG, Munich, Germany; 23.6 A 700/900mW/ Channel CMOS Dual Analog Front-End IC for VDSL with Integrated 11.5/14.5dBm Line Drivers; 2003 IEEE International Solid-State Circuits Conference; ISSCC 2003/Session 23/Mixed-Signal and Wireline Techniques; 10 pages.

M. Moyal, M. Groepl, H. Werker, G. Mitteregger, J. Schambacher; Xignal Technologies AG, Munich, Germany; A 700/900mW/Channel CMOS Dual Analog Front-End IC for VDSL with Integrated 11.5/14.5dBm Line Drivers; Outline, Overview 24 pages.

* cited by examiner

PROGRAMMABLE HIGH PASS AMPLIFIER FOR PERPENDICULAR RECORDING SYSTEMS

CROSS-REFERENCE TO RELATED APPLICATIONS

This application is related to U.S. patent application Ser. Nos. 10/072,843, filed on Feb. 6, 2002, Ser. No. 10/838,040, filed May 3, 2004, Ser. No. 10/459,731, filed Jul. 11, 2003 and 10/814,534, filed Mar. 31, 2004, which are hereby incorporated by reference in their entirety.

FIELD OF THE INVENTION

The present invention relates to amplifiers, and more particularly to high pass amplifiers for read elements in perpendicular recording systems.

BACKGROUND OF THE INVENTION

Referring now to FIG. 1, an exemplary magnetic storage system 10 such as a hard disk drive is shown. A buffer 14 stores data that is associated with the control of the hard disk drive and/or buffers data to optimize block sizes for increased transfer speed. The buffer 14 may employ SDRAM or other types of low latency memory. A processor 16 performs processing that is related to the operation of the hard disk drive. A hard disk controller (HDC) 18 communicates with the buffer 14, the processor 16, a spindle/voice coil motor (VCM) driver 20, and/or a read/write channel circuit 24. A host 26 sends data read/write requests to the HDC 18.

During a write operation, the read/write channel circuit (or read channel circuit) 24 encodes the data to be written onto the storage medium. The read/write channel circuit 24 processes the signal for reliability and may include, for example error correction coding (ECC), run length limited coding (RLL), and the like. During read operations, the read/write channel circuit 24 converts an analog output from the medium to a digital signal. The converted signal is then detected and decoded by known techniques to recover the data written on the hard disk drive.

One or more platters 28 include a magnetic coating that stores magnetic fields. The platters 28 are rotated by a spindle motor that is schematically shown at 30. Generally the spindle motor 30 rotates the platter 28 at a fixed speed during the read/write operations. One or more read/write arms 34 move relative to the platters 28 to read and/or write data to/from the platters 28. The spindle/VCM driver 20 controls the spindle motor 30, which rotates the platter 28. The spindle/VCM driver 20 also generates control signals that position the read/write arm 34, for example using a voice coil actuator, a stepper motor or any other suitable actuator.

A read/write device 36 is located near a distal end of the read/write arm 34. The read/write device 36 includes a write element such as an inductor that generates a magnetic field. The read/write device 36 also includes a read element (such as a magneto-resistive (MR) sensor) that senses the magnetic fields on the platter 28. A preamplifier (preamp) 40 amplifies analog read/write signals. When reading data, the preamp 40 amplifies low level signals from the read element and outputs the amplified signal to the read/write channel circuit 24. The preamp 40 may include a high pass amplifier. While writing data, a write current that flows through the write element of the read/write channel circuit 24 is switched to produce a magnetic field having a positive or negative polarity. The positive or negative polarity is stored by the platter 28 and is used to represent data.

Referring now to FIG. 2, the read/write channel circuit 24 outputs write signals $w_{dx}$ and $w_{dy}$ to the preamp 40 when writing data. The preamp 40 amplifies the write signals using a write amplifier 42. The amplified write signals are output to the read/write device 36. When reading data, the preamp 40 receives signals from the read/write device 36, amplifies the signals using a read amplifier 44, and outputs amplified read signals $r_{dx}$ and $r_{dy}$ to the read/write channel circuit 24. Other types of the read elements of the read/write device 36 include tunneling magneto-resistive (TMR) and giant magneto-resistive (GMR) sensors.

SUMMARY OF THE INVENTION

A high pass amplifier according to the present invention comprises a first amplifier including an input and an output. A second amplifier includes an input that communicates with the output of the first amplifier and an output. A first resistance includes a first end that communicates with the input of the first amplifier and an output that communicates with the output of the first amplifier. A first capacitance includes a first end that communicates with the input of the first amplifier. A second resistance includes a first end that communicates with a second end of the first capacitance and a second end that communicates with the output of the second amplifier.

In other features, the first resistance is a variable resistance. The first resistance includes a resistive network including a plurality of resistances and a switch that communicates with at least one of the plurality of resistances. A first resistance value of the first resistance is greater than a second resistance value of the second resistance. The first resistance value is approximately one order of magnitude higher than the second resistance value.

In still other features, the first and second amplifiers include an operational amplifier, a voltage mode amplifier and/or a transimpedance amplifier.

In other features, the high pass amplifier is a differential high pass amplifier. A system comprises the high pass amplifier having an input coupled to a magneto-resistive sensor. A flex cable couples the magneto-resistive sensor to the high pass amplifier. A characteristic impedance at the one end of the flex cable substantially matches a characteristic impedance at an input of the differential high pass amplifier. A characteristic impedance at an opposite end of the flex cable substantially matches a characteristic impedance of the read element.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
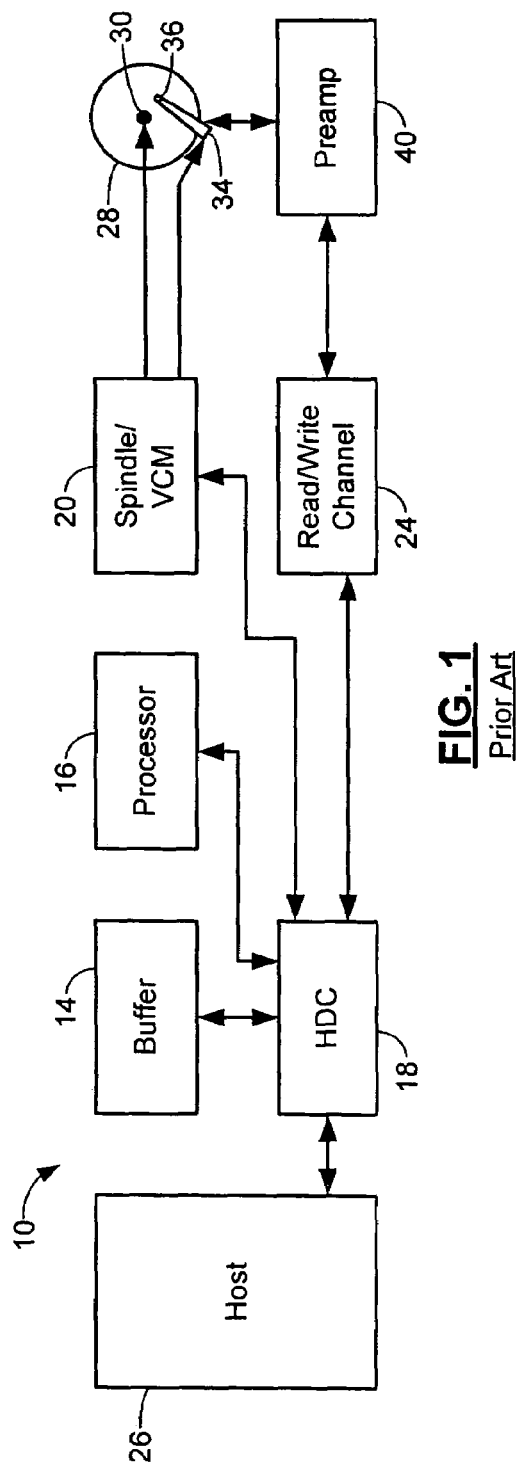
FIG. 1 is a functional block diagram of an exemplary data storage device according to the prior art.
Figure 2:
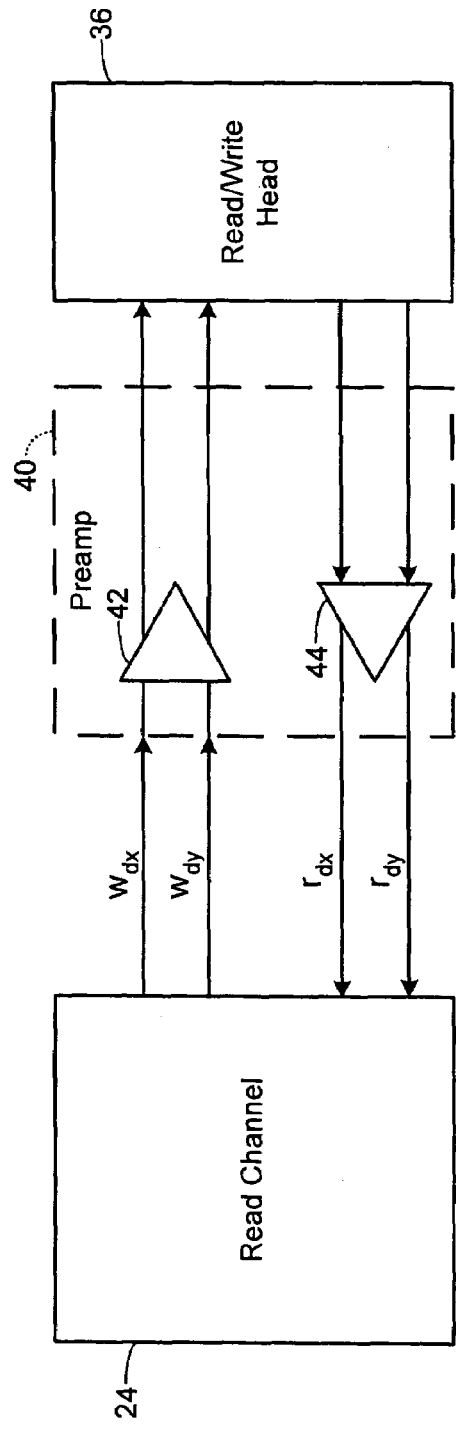
FIG. 2 is a functional block diagram of a read channel circuit and preamp according to the prior art.

The following description of the preferred embodiment(s) is merely exemplary in nature and is in no way intended to limit the invention, its application, or uses. For purposes of clarity, the same reference numbers will be used in the drawings to identify the same elements. As used herein, "characteristic impedance" shall refer to a ratio of a complex voltage between conductors of a transmission line to a complex current on the conductors in the same transverse plane with the sign chosen such that the real part is positive, as defined by "The Authoritative Dictionary of IEEE Standards Terms", Seventh Edition (2000).

Figure 3:
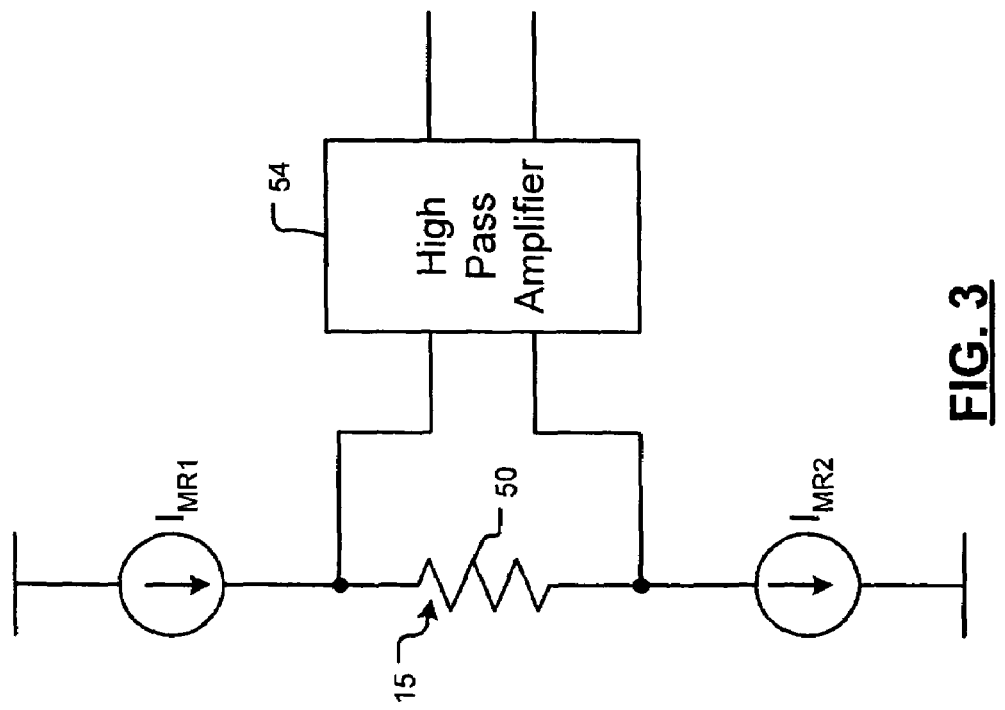
FIG. 3 is an electrical schematic and functional block diagram of a high pass amplifier according to the present invention coupled to a read element.

Referring now to FIG. 3, a read/write device 15 is shown to include a resistance 50, which represents an MR sensor, a TMR sensor, a GMR sensor and/or other suitable read element. A first current source $I_{MR1}$ biases one end of the resistance 50. A second current source $I_{MR2}$ biases an opposite end of the resistance 50. A differential high pass amplifier 54 includes a first input that is connected to the one end of the resistance 50 and an opposite and that is connected to the opposite end of the resistance 50.

Figure 4:
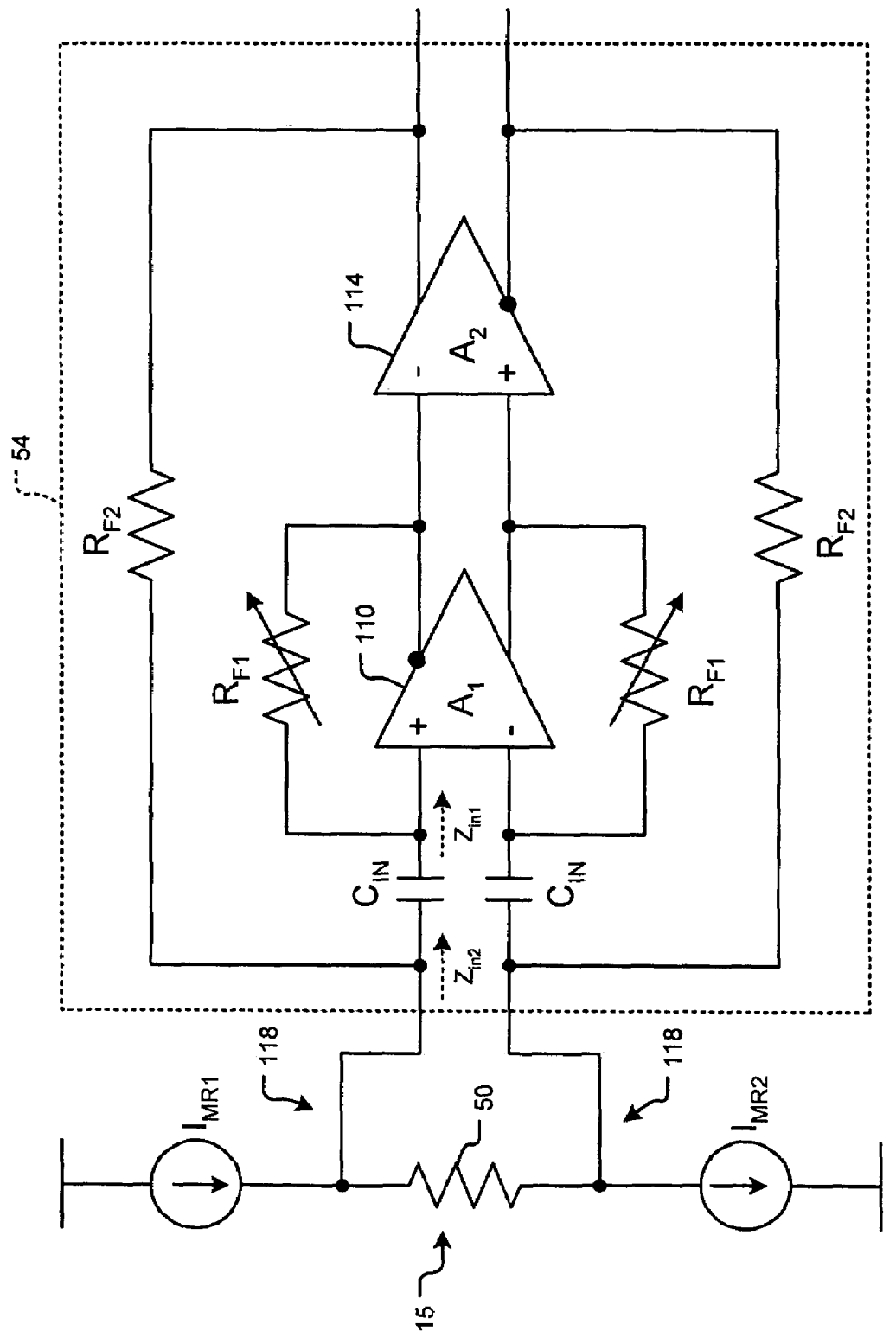
FIG. 4 is an electrical schematic of a differential high pass amplifier according to the present invention that is coupled to a read element.

Referring now to FIG. 4, the differential high pass amplifier 54 according to the present invention is shown. The high pass amplifier 54 includes a first operational amplifier (opamp) 110 having first and second outputs that communicate with a second opamp 114. First and second inputs of the opamp 110 are coupled by input capacitance $C_{IN}$ to opposite ends of the resistance 50, which represents the read element of the read/write device 15. First and second variable feedback resistances $R_{F1}$ have first ends that communicate with the first and second inputs of the opamp 110 and second ends that communicate with first and second outputs of the opamp 110.

Third and fourth feedback resistances $R_{F2}$ have first ends that communicate with opposite ends of the resistance 50 and second ends that communicate with first and second outputs of the second opamp 114. In one implementation, $R_{F1} \gg R_{F2}$. For example, $R_{F1}$ may have a resistance value between 100 k and 200 k and $R_{F2}$ has a resistance value between 2 k and 10 k.

The impedance looking into the input of the first opamp 110 or $$Z_{in1} \approx \frac{R_{F1}}{A_1}$$

where $A_1$ is the gain of the first opamp 110. The impedance at $$Z_{in2} \approx \frac{R_{F2}}{A_1 A_2}.$$

Therefore, the high pass amplifier 54 provides a relatively small impedance relative to the read element without adversely impacting the location of the pass bandwidth of the high pass amplifier 54. The high pass corner is related to $Z_{in1} \| C_{in}$.

Figure 5:
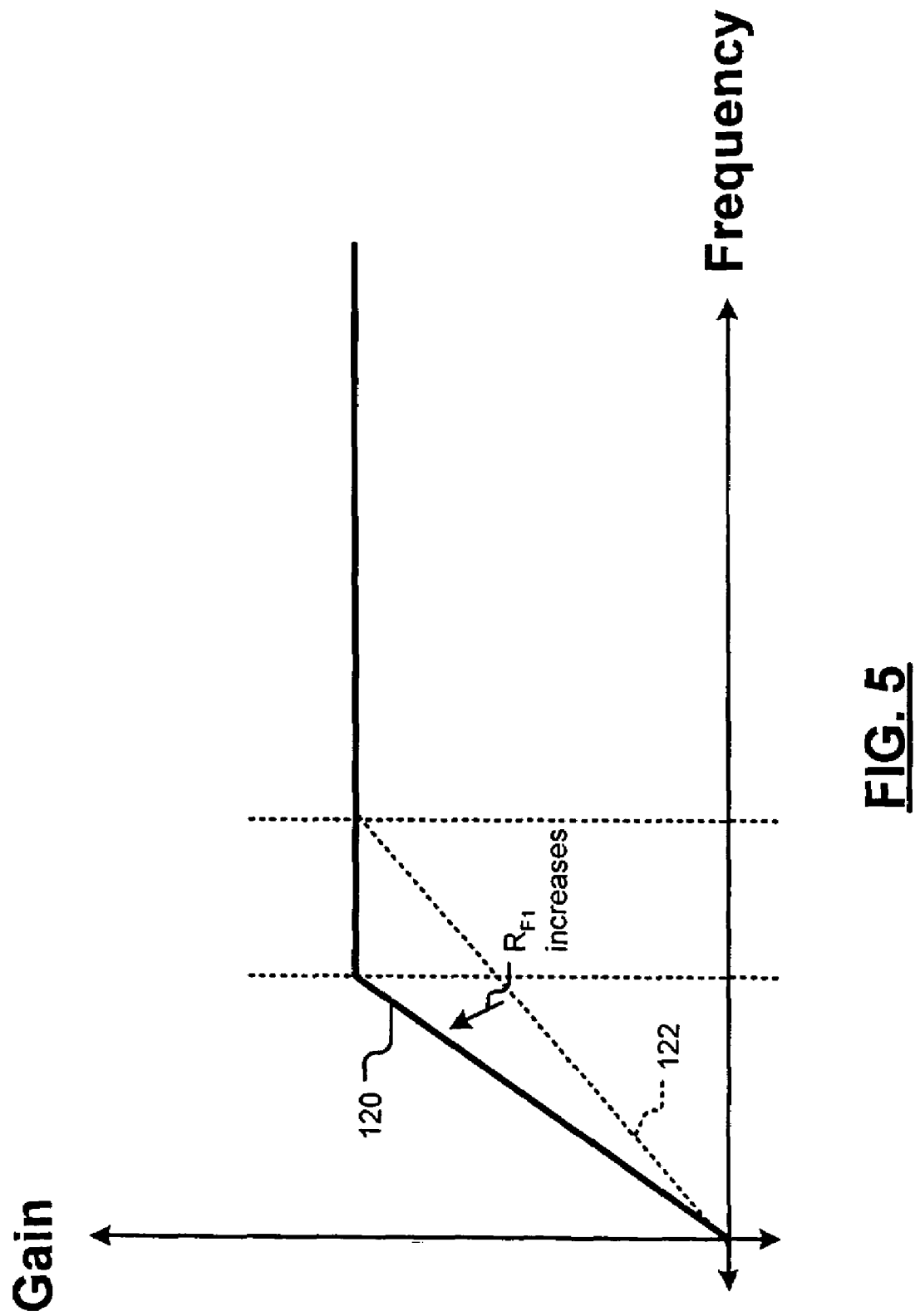
FIG. 5 is a graph illustrating gain as a function of frequency for the high pass amplifier of FIG. 4.

Referring now to FIG. 5, a comparison is made between a bandwidth 120 of the high pass filter with the feedback as shown in FIG. 4 and a bandwidth 122 of a high pass filter having feedback provided by $R_{F1}$ connected on the opposite side of $C_{IN}$. The corner of the high pass amplifier 54 occurs at a lower frequency. If $R_{F1}$ changes, the high pass corner also changes as shown in FIG. 5.

Figure 6:
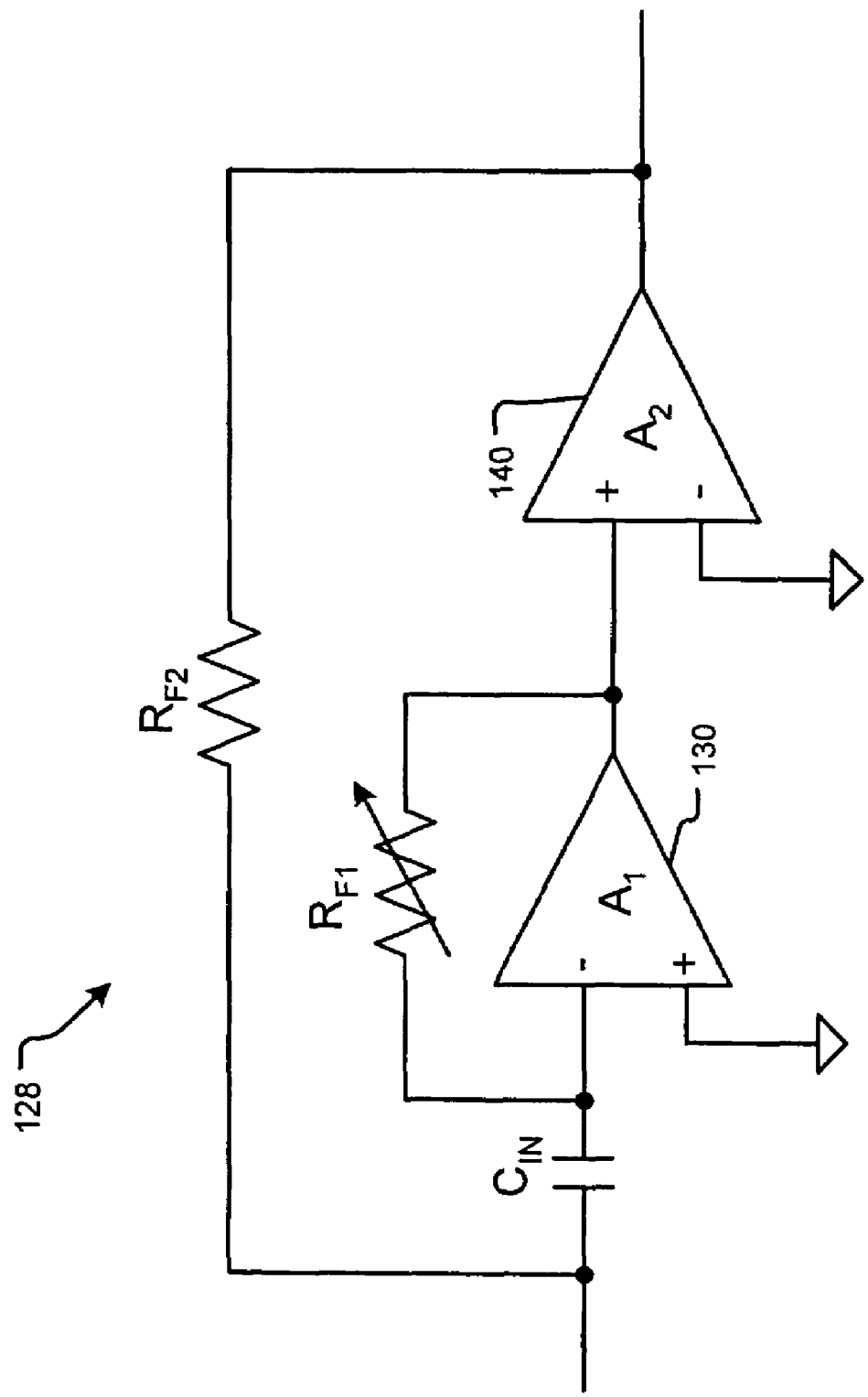
FIG. 6 is an electrical schematic an alternate high pass amplifier.

Referring now to FIG. 6, an alternate or nondifferential embodiment of a high pass amplifier 128 is shown. Inverting opamp 130 has an inverting input coupled to the input capacitance $C_{IN}$ and to one end of the variable feedback resistance $R_{F1}$. An opposite end of variable feedback resistance $R_{F1}$ communicates with an output of the opamp 130. The output of the opamp 130 also communicates with the input of an opamp 140. A feedback resistance $R_{F2}$ has one end that communicates with an opposite end of the input capacitance $C_{IN}$ and an opposite end that communicates with the output of the opamp 140.

As can be appreciated, the high pass amplifiers according to the present invention have an improved high pass corner frequency. The feedback resistance $R_{F2}$ can be set relatively low without significantly adversely impacting the pass bandwidth of the high pass amplifier. The high pass amplifiers are single pole high pass amplifiers from input to output. The resistances disclosed herein can be discrete resistors, poly resistors, transistor-based resistors and/or other suitable resistances.

Figure 7A:
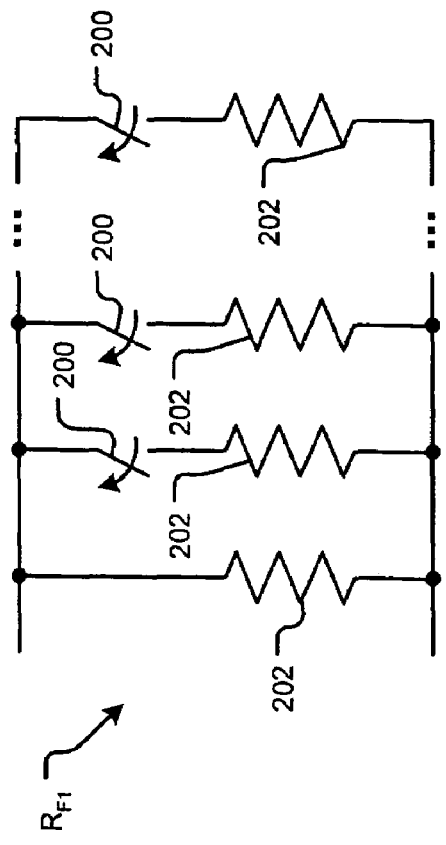
FIGS. 7A and 7B show exemplary resistive networks.
Figure 7B:
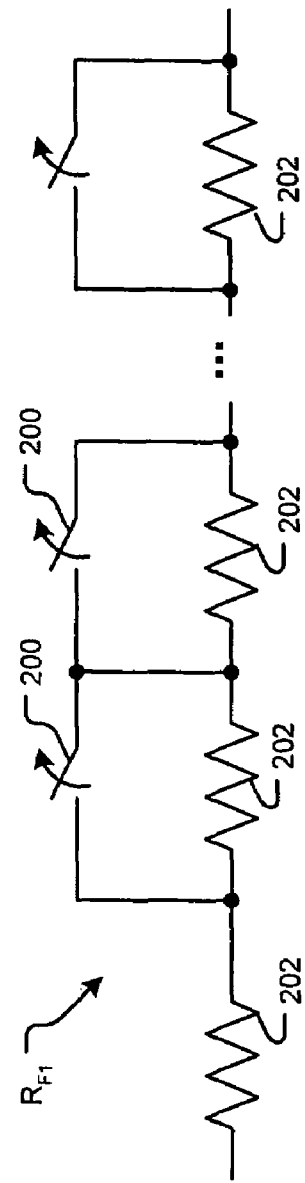

Referring now to FIGS. 7A and 7B, the variable resistances $R_{F1}$ can also be parallel, serial or hybrid resistive networks with switches or transistors 200 that are used to switch resistances 202 to change $R_{F1}$ and to program or adjust the high pass corner.

As can be appreciated, while operational amplifiers are shown and described above, voltage mode amplifiers and transimpedance amplifiers can also be used.

Figure 8:
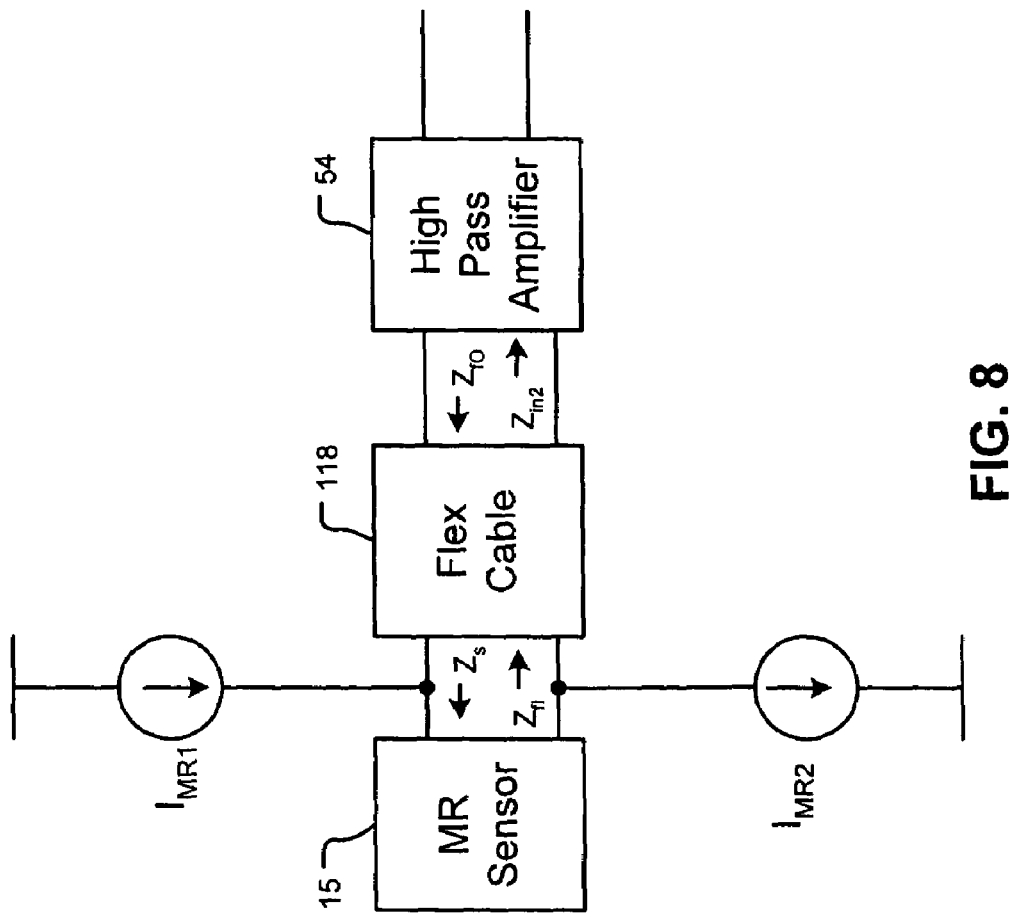
FIG. 8 is a functional block diagram illustrates a characteristic impedance at opposite ends of a flex cable, at the read element and at the input of the high pass amplifier.

Referring now to FIG. 8, a functional block diagram illustrates the characteristic impedance $Z_{fI}$ at one end of a flex cable 118, the characteristic impedance $Z_{fO}$ at the opposite end of the flex cable 118, the characteristic impedance $Z_r$ at the inputs of the read element 15, and the characteristic impedance $Z_{in2}$ at the input of the high pass amplifier 54. In a preferred embodiment, $Z_{fI}$ is substantially equal to $Z_r$ and $Z_{fO}$ is substantially equal to $Z_{in2}$, which provides maximum power transfer from the read element 15 through the flex cable 118 to the high pass amplifier 54. In some embodiments, $Z_{fO}$ and $Z_{fI}$ are also substantially equal.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A system comprising:
a magneto-resistive read element having first and second ends; and
a differential high pass amplifier comprising:
a first differential amplifier including first and second inputs and first and second outputs;
a second differential amplifier including first and second inputs that communicate with said first and second outputs of said first differential amplifier, respectively, and first and second outputs;
first and second resistances including first ends that communicate with said first and second inputs of said first differential amplifier, respectively, and second ends that communicate with said first and second outputs of said first differential amplifier, respectively;
first and second capacitances including first ends that communicate with said first and second inputs of said first differential amplifier, respectively; and
third and fourth resistances including first ends that communicate with said second ends of said first and second capacitances and with said first and second ends of said magneto-resistive read element, respectively, and second ends that communicate with said first and second outputs of said second differential amplifier, respectively.

2. The system of claim 1 wherein said first and second resistances are variable resistances.

3. The system of claim 1 wherein first resistance values of said first and second resistances are greater than second resistance values of said third and fourth resistances.

4. The system of claim 3 wherein said first resistance values are approximately one order of magnitude higher than said second resistance values.

5. The system of claim 1 wherein said first and second capacitances include first and second capacitors, respectively.

6. The system of claim 1 wherein said magneto-resistive read element includes at least one of a magneto-resistive (MR) sensor, a tunneling MR sensor and/or a giant MR sensor.

7. A perpendicular recording system comprising the system of claim 1.

8. The system of claim 1 wherein said first and second differential amplifiers include an operational amplifier.

9. The system of claim 1 wherein said first and second differential amplifiers include a voltage mode amplifier.

10. The system of claim 1 wherein said first and second differential amplifiers include a transimpedance amplifier.

11. The system of claim 1 further comprising a flex cable having one end that communicates with said first and second ends of said magneto-resistive read element and an opposite end that communicates with said second end of said first and second capacitances.

12. The system of claim 11 wherein a characteristic impedance at said opposite end of said flex cable substantially matches a characteristic impedance at an input of said differential high pass amplifier and a characteristic impedance at said one end of said flex cable substantially matches a characteristic impedance of said magneto-resistive read element.

13. A system comprising:
a read element having first and second ends; and
a differential high pass amplifier, comprising:
a first differential amplifier including first and second inputs and first and second outputs;
a second differential amplifier including first and second inputs that communicate with said first and second outputs of said first differential amplifier, respectively, and first and second outputs;
first and second resistances including first ends that communicate with said first and second inputs of said first differential amplifier, respectively, and second ends that communicate with said first and second outputs of said first differential amplifier, respectively;
first and second capacitances including first ends that communicate with said first and second inputs of said first differential amplifier, respectively; and
third and fourth resistances including first ends that communicate with said second ends of said first and second capacitances, respectively, and second ends that communicate with said first and second outputs of said second differential amplifier, respectively,
wherein said first resistance comprises a resistive network indluding a plurality of resistances and a switch that communicates with at least one of said plurality of resistances.

14. A differential high pass amplifier, comprising:
a first differential amplifier including first and second inputs and first and second outputs;
a second differential amplifier including first and second inputs that communicate with said first and second outputs of said first differential amplifier, respectively, and first and second outputs;
first and second resistances including first ends that communicate with said first and second inputs of said first differential amplifier, respectively, and second ends that communicate with said first and second outputs of said first differential amplifier, respectively;
first and second capacitances including first ends that communicate with said first and second inputs of said first differential amplifier, respectively; and
third and fourth resistances including first ends that communicate with said second ends of said first and second capacitances, respectively, and second ends that communicate with said first and second outputs of said second differential amplifier, respectively,
wherein said first and second differential amplifiers include a transimpedance amplifier.

15. The differential high pass amplifier of claim 14 wherein said first and second resistances include variable resistances.

16. The differential high pass amplifier of claim 14 wherein said first resistance values are approximately one order of magnitude higher than said second resistance values.

17. A preamp comprising the differential high pass amplifier of claim 14.

18. The differential high pass amplifier of claim 14 wherein said first and second capacitances include first and second capacitors, respectively.

19. The differential high pass amplifier of claim 14 wherein said first and second differential amplifiers include an operational amplifier.

20. The differential high pass amplifier of claim 14 wherein said first and second differential amplifiers include a voltage mode amplifier.

21. The differential high pass amplifier of claim 14 wherein said second differential amplifiers include said transimpedance amplifier.

22. The differential high pass amplifier of claim 14 wherein said second ends of said first and second resistances are directly coupled to said first and second inputs of said second differential amplifier.

23. The differential high pass amplifier of claim 14 wherein said first and second outputs of said first differential amplifier are directly coupled to said first and second inputs of said second differential amplifier.

24. A system comprising:
a differential high pass amplifier, comprising:
a first differential amplifier including first and second inputs and first and second outputs;
second differential amplifier including first and second inputs that communicate with said first and second outputs of said first differential amplifier, respectively, and first and second outputs;
first and second resistances including first ends that communicate with said first and second inputs of said first differential amplifier, respectively, and second ends that communicate with said first and second outputs of said first differential amplifier, respectively;
first and second capacitances including first ends that communicate with said first and second inputs of said first differential amplifier, respectively; and
third and fourth resistances including first ends that communicate with said second ends of said first and second capacitances, respectively, and second ends that communicate with said first and second outputs of said second differential amplifier, respectively;
a read element having first and second ends that communicate with said second ends of said first and second capacitances, respectively; and
a flex cable having one end that communicates with said read element and an opposite end that communicates with said second ends of said first and second capacitances.

25. The system of claim 24 wherein a characteristic impedance at said opposite end of said flex cable substantially matches a characteristic impedance at an input of said differential high pass amplifier and a characteristic impedance at said one end of said flex cable substantially matches a characteristic impedance of said read element.

26. A high pass amplifier, comprising:
a first amplifier including an input and an output;
a second amplifier including an input that communicates with said output of said first amplifier and an output;
a first resistance including a first end that communicates with said input of said first amplifier and a second end that communicates with said output of said first amplifier;
a first capacitance including a first end that communicates with said input of said first amplifier;
a second resistance including a first end that communicates with a second end of said first capacitance and a second end that communicates with said output of said second amplifier, and
a magneto-resistive read element that communicates with said second end of said first capacitance,
wherein a first resistance value of said first resistance is greater than a second resistance value of said second resistance.

27. The high pass amplifier of claim 26 wherein said first resistance includes a variable resistance.

28. The high pass amplifier of claim 26 wherein said first resistance value is approximately one order of magnitude higher than said second resistance value.

29. The high pass amplifier of claim 26 wherein said first and second amplifiers include an operational amplifier.

30. The high pass amplifier of claim 26 wherein said first and second amplifiers include a voltage mode amplifier.

31. The high pass amplifier of claim 26 wherein said first and second amplifiers include a transimpedance amplifier.

32. A system comprising:
a magneto-resistive read element having first and second ends; and
a differential high pass amplifying means for amplifying and high pass filtering an output of said magneto-resistive read element comprising:
a first differential amplifying and including first and second inputs and first and second outputs;
a second differential amplifying means for amplifying and including first and second inputs that communicate with said first and second outputs of said first differential amplifying means, respectively, and first and second outputs;
first and second resistance means for providing resistance and including first ends that communicate with said first and second inputs of said first differential amplifying means, respectively, and second ends that communicate with said first and second outputs of said first differential amplifying means, respectively;
first and second capacitance means for providing capacitance and including first ends that communicate with said first and second inputs of said first differential amplifying means, respectively; and
third and fourth resistance means for providing resistance and including first ends that communicate with said second ends of said first and second capacitance means and with said first and second ends of said sensing means, respectively, and second ends that communicate with said first and second outputs of said second differential amplifying means, respectively.

33. The system of claim 32 wherein said first and second resistance means are variable resistances.

34. The system of claim 32 wherein said first resistance means comprises a resistive network including a plurality of resistances and switching means for switching that communicates with at least one of said plurality of resistances.

35. The system of claim 32 wherein said first and second capacitance means include first and second capacitors, respectively.

36. The system of claim 32 wherein said magneto-resistive sensing means includes at least one of a magneto-resistive (MR) sensor, a tunneling MR sensor and/or a giant MR sensor.

37. The system of claim 32 wherein said first and second differential amplifying means include an operational amplifier.

38. The system of claim 32 wherein said first and second differential amplifying means include a voltage mode amplifier.

39. The system of claim 32 wherein said first and second differential amplifying means include a transimpedance amplifier.

40. A system comprising:
magneto-resistive sensing means for sensing and having first and second ends; and
differential high pass amplifying means for amplifying and high pass filtering comprising:
first differential amplifying means for amplifying and including first and second inputs and first and second outputs;
second differential amplifying means for amplifying and including first and second inputs that communicate with said first and second outputs of said first differential amplifying means, respectively, and first and second outputs;

first and second resistance means for providing resistance and including first ends that communicate with said first and second inputs of said first differential amplifying means, respectively, and second ends that communicate with said first and second outputs of said first differential amplifying means, respectively;

first and second capacitance means for providing capacitance and including first ends that communicate with said first and second inputs of said first differential amplifying means, respectively; and third and fourth resistance means for providing resistance and including first ends that communicate with said second ends of said first and second capacitance means and with said first and second ends of said magneto-resistive sensing means, respectively, and second ends that communicate with said first and second outputs of said second differential amplifying means, respectively, wherein first resistance values of said first and second resistance means are greater than second resistance values of said third and fourth resistance means.

41. The system of claim 40 wherein said first resistance values are approximately one order of magnitude higher than said second resistance values.

42. A perpendicular recording system comprising:

magneto-resistive sensing means for sensing and having first and second ends; and differential high pass amplifying means for amplifying and high pass filtering comprising:

first differential amplifying means for amplifying and including first and second inputs and first and second outputs;

second differential amplifying means for amplifying and including first and second inputs that communicate with said first and second outputs of said first differential amplifying means, respectively, and first and second outputs;

first and second resistance means for providing resistance and including first ends that communicate with said first and second inputs of said first differential amplifying means, respectively, and second ends that communicate with said first and second outputs of said first differential amplifying means, respectively;

first and second capacitance means for providing capacitance and including first ends that communicate with said first and second inputs of said first differential amplifying means, respectively; and third and fourth resistance means for providing resistance and including first ends that communicate with said second ends of said first and second capacitance means and with said first and second ends of said magneto-resistive sensing means, respectively, and second ends that communicate with said first and second outputs of said second differential amplifying means, respectively.

43. A system comprising:

sensing means for sensing and having first and second ends;

differential high pass amplifying means for amplifying and high pass filtering comprising:

first differential amplifying means for amplifying and including first and second inputs and first and second outputs;

second differential amplifying means for amplifying and including first and second inputs that communicate with said first and second outputs of said first differential amplifying means, respectively, and first and second outputs;

first and second resistance means for providing resistance and including first ends that communicate with said first and second inputs of said first differential amplifying means, respectively, and second ends that communicate with said first and second outputs of said first differential amplifying means, respectively;

first and second capacitance means for providing capacitance and including first ends that communicate with said first and second inputs of said first differential amplifying means, respectively; and third and fourth resistance means for providing resistance and including first ends that communicate with said second ends of said first and second capacitance means and with said first and second ends of said sensing means, respectively, and second ends that communicate with said first and second outputs of said second differential amplifying means, respectively; and a flex cable having one end that communicates with said first and second ends of said sensing means and an opposite end that communicates with said second ends of said first and second capacitance means.

44. The system of claim 43 wherein a characteristic impedance at said opposite end of said flex cable substantially matches a characteristic impedance at an input of said differential high pass amplifying means and a characteristic impedance at said one end of said flex cable substantially matches a characteristic impedance of said sensing means.

45. A differential high pass amplifier, comprising:

first differential amplifying means for amplifying and including first and second inputs and first and second outputs;

second differential amplifying means for amplifying and including first and second inputs that communicate with said first and second outputs of said first differential amplifying means, respectively, and first and second outputs;

first and second resistance means for providing resistance and including first ends that communicate with said first and second inputs of said first differential amplifying means, respectively, and second ends that communicate with said first and second outputs of said first differential amplifying means, respectively;

first and second capacitance means for providing capacitance and including first ends that communicate with said first and second inputs of said first differential amplifying means, respectively;

third and fourth resistance means for providing resistance and including first ends that communicate with said second ends of said first and second capacitance means, respectively, and second ends that communicate with said first and second outputs of said second differential amplifying means, respectively; and a magneto-resistive sensing means having first and second ends that communicate with said second ends of said first and second capacitance means, respectively, wherein first resistance values of said first and second resistance means are greater than second resistance values of said third and fourth resistance means.

46. The differential high pass amplifier of claim 45 wherein said first and second resistance means include variable resistances.

47. The differential high pass amplifier of claim 45 wherein said first resistance values are approximately one order of magnitude higher than said second resistance values.

48. A system comprising the differential high pass amplifier of claim 45.

49. A preamp comprising the differential high pass amplifier of claim 45.

50. The differential high pass amplifier of claim 45 wherein said first and second capacitance means include first and second capacitors, respectively.

51. The differential high pass amplifier of claim 45 wherein said first and second amplifying means include an operational amplifier.

52. The differential high pass amplifier of claim 45 wherein said first and second amplifying means include a voltage mode amplifier.

53. The differential high pass amplifier of claim 45 wherein said first and second amplifying means include a transimpedance amplifier.

54. A system, comprising:
 first differential amplifying means for amplifying and including first and second inputs and first and second outputs;
 second differential amplifying means for amplifying and including first and second inputs that communicate with said first and second outputs of said first differential amplifying means, respectively, and first and second outputs;
 first and second resistance means for providing resistance and including first ends that communicate with said first and second inputs of said first differential amplifying means, respectively, and second ends that communicate with said first and second outputs of said first differential amplifying means, respectively;
 first and second capacitance means for providing capacitance and including first ends that communicate with said first and second inputs of said first differential amplifying means, respectively;
 third and fourth resistance means for providing resistance and including first ends that communicate with said second ends of said first and second capacitance means, respectively, and second ends that communicate with said first and second outputs of said second differential amplifying means, respectively; and
 sensing means for sensing and having first and second ends that communicate with said second ends of said first and second capacitance means, respectively, wherein said sensing means includes at least one of a magneto-resistive (MR) sensor, a tunneling MR sensor and a giant MR sensor.

55. A perpendicular recording system comprising:
 first differential amplifying means for amplifying and including first and second inputs and first and second outputs;
 second differential amplifying means for amplifying and including first and second inputs that communicate with said first and second outputs of said first differential amplifying means, respectively, and first and second outputs;
 first and second resistance means for providing resistance and including first ends that communicate with said first and second inputs of said first differential amplifying means, respectively, and second ends that communicate with said first and second outputs of said first differential amplifying means, respectively;
 first and second capacitance means for providing capacitance and including first ends that communicate with said first and second inputs of said first differential amplifying means, respectively;
 third and fourth resistance means for providing resistance and including first ends that communicate with said second ends of said first and second capacitance means, respectively, and second ends that communicate with said first and second outputs of said second differential amplifying means, respectively; and
 magneto-resistive sensing means for sensing and having first and second ends that communicate with said second ends of said first and second capacitance means, respectively.

56. The system of claim 55 further comprising a flex cable having one end that communicates with said magneto-resistive sensing means and an opposite end that communicates with said first and second capacitance means.

57. The system of claim 56 wherein a characteristic impedance at said opposite end of said flex cable substantially matches a characteristic impedance at an input of said differential high pass amplifier and a characteristic impedance at said one end of said flex cable substantially matches a characteristic impedance of said magneto-resistive sensing means.

58. A high pass amplifier, comprising:
 first amplifying means for amplifying and including an input and an output;
 second amplifying means for amplifying and including an input that communicates with said output of said first amplifying means and an output;
 first resistance means for providing resistance and including a first end that communicates with said input of said first amplifying means and an output that communicates with said output of said first amplifying means;
 first capacitance means for providing capacitance and including a first end that communicates with said input of said first amplifying means; and
 second resistance means for providing resistance and including a first end that communicates with a second end of said first capacitance means and a second end that communicates with said output of said second amplifying means, and
 a magneto-resistive sensing means that communicates with said second end of said first capacitance means,
 wherein a first resistance value of said first resistance means is greater than a second resistance value of said second resistance means.

59. The high pass amplifier of claim 58 wherein said first resistance means includes a variable resistance.

60. The high pass amplifier of claim 58 wherein said first resistance value is approximately one order of magnitude higher than said second resistance value.

61. The high pass amplifier of claim 58 wherein said first and second amplifying means include an operational amplifier.

62. The high pass amplifier of claim 58 wherein said first and second amplifying means include a voltage mode amplifier.

63. The high pass amplifier of claim 58 wherein said first and second amplifying means include a transimpedance amplifier.

* * * * *

UNITED STATES PATENT AND TRADEMARK OFFICE
CERTIFICATE OF CORRECTION

PATENT NO. : 7,558,014 B1  Page 1 of 1
APPLICATION NO. : 10/876216
DATED : July 7, 2009
INVENTOR(S) : Thart Fah Voo et al.

It is certified that error appears in the above-identified patent and that said Letters Patent is hereby corrected as shown below:

| | |
|---|---|
| Page 2 | Under "FOREIGN PATENT DOCUMENTS" delete "WO 99/466607" reference is a duplicate |
| Page 2 | Under "OTHER PUBLICATIONS" second reference U.S. App. No. 10/459,731 delete "Aplifier" and insert -- Amplifier -- |
| Column 3, Line 10 | Insert -- that -- after "diagram" |
| Column 3, Line 37 | Delete "and" after "opposite" |
| Column 6, Line 14 | Delete ",respectively," after "capacitances," After "and" insert -- and with said first and -- After "second ends" insert -- of said read element, respectively, and second ends -- |

Signed and Sealed this

Twenty-fifth Day of August, 2009

David J. Kappos
*Director of the United States Patent and Trademark Office*